(12) United States Patent
Stewart et al.

(10) Patent No.: US 8,008,208 B2
(45) Date of Patent: Aug. 30, 2011

(54) METHOD OF CLEANING AND FORMING A NEGATIVELY CHARGED PASSIVATION LAYER OVER A DOPED REGION

(75) Inventors: Michael P. Stewart, San Francisco, CA (US); Lisong Zhou, Fremont, CA (US); Jen Shu, Saratoga, CA (US); Li (Sherry) Xu, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/962,483

(22) Filed: Dec. 7, 2010

(65) Prior Publication Data
US 2011/0136286 A1    Jun. 9, 2011

Related U.S. Application Data

(60) Provisional application No. 61/267,343, filed on Dec. 7, 2009.

(51) Int. Cl.
*H01L 21/302*    (2006.01)

(52) U.S. Cl. ............ 438/711; 438/57; 438/80; 438/700; 438/E31.119

(58) Field of Classification Search .............. 438/72–80, 438/700–711, 57, 458; 136/255–256
See application file for complete search history.

(56) References Cited

U.S. PATENT DOCUMENTS

2010/0015749 A1*   1/2010   Borden .......................... 438/72
2010/0311203 A1*   12/2010  Borden et al. ................. 438/98

* cited by examiner

*Primary Examiner* — Dung A. Le
(74) *Attorney, Agent, or Firm* — Patterson & Sheridan, L.L.P.

(57) ABSTRACT

The present invention generally provides a method of forming a high efficiency solar cell device by preparing a surface and/or forming at least a part of a high quality passivation layer on a silicon containing substrate. Embodiments of the present invention may be especially useful for preparing a surface of a p-type doped region formed on a silicon substrate so that a high quality passivation layer can be formed thereon. In one embodiment, the methods include exposing a surface of the solar cell substrate to a plasma to clean and modify the physical, chemical and/or electrical characteristics of the surface.

15 Claims, 7 Drawing Sheets

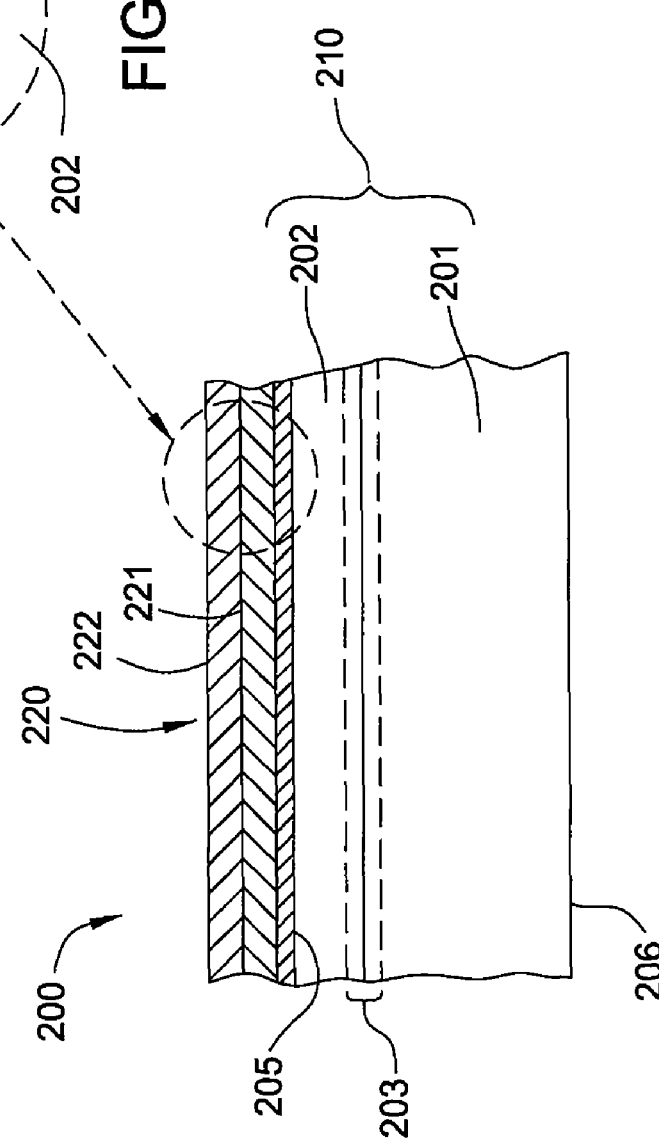

METHOD OF CLEANING AND FORMING A NEGATIVELY CHARGED PASSIVATION LAYER OVER A DOPED REGION

CROSS-REFERENCE TO RELATED APPLICATIONS

This application claims benefit of U.S. Provisional Patent Application Ser. No. 61/267,343, filed Dec. 7, 2009, which is incorporated by reference herein.

BACKGROUND OF THE INVENTION

1. Field of the Invention

Embodiments of the present invention generally relate to the fabrication of solar cells and particularly to a device structure and method of passivating a surface of a crystalline silicon solar cell.

2. Description of the Related Art

Solar cells are photovoltaic devices that convert sunlight directly into electrical power. The most common solar cell material is silicon (Si), which is in the form of single, polycrystalline or multi-crystalline substrates. Because the cost of electricity generated using silicon-based solar cells is higher than the cost of electricity generated by traditional methods, there has been an effort to reduce the cost of manufacturing solar cells that does not adversely affect the overall efficiency of the solar cell.

FIG. 1 schematically depicts a cross-sectional view of a standard silicon solar cell 100 fabricated from a crystalline silicon substrate 110. The substrate 110 includes a base region 101, an emitter region 102, a p-n junction region 103, a dielectric passivation layer 104, front electrical contact 107 and rear electrical contact 108. The p-n junction region 103 is disposed between base region 101 and emitter region 102 of the solar cell, and is the region in which electron-hole pairs are generated when solar cell 100 is illuminated by incident photons. Dielectric passivation layer 104 may act as an antireflective coating (ARC) layer for solar cell 100 as well as a passivation layer for the surface 105 of emitter region 102.

The efficiency of solar cell 100 may be enhanced by use of an ARC layer. When light passes from one medium to another, for example from air to glass, or from glass to silicon, some of the light may reflect off of the interface between the two media, even when the incident light is normal to the interface. The fraction of light reflected is a function of the difference in refractive index between the two media, wherein a greater difference in refractive index results in a higher fraction of light being reflected from the interface. An ARC layer disposed between the two media and having a refractive index whose value is between the refractive indices of the two media is known to reduce the fraction of light reflected. Hence, the presence of an ARC layer on a light-receiving surface of solar cell 100, such as dielectric passivation layer 104 on surface 105, reduces the fraction of incident radiation reflected off of solar cell 100 and which, therefore, cannot not be used to generate electrical energy.

When light falls on the solar cell, energy from the incident photons generates electron-hole pairs on both sides of p-n junction region 103. In a typical solar cell, which comprises an n-type emitter region and a p-type base region, electrons diffuse across the p-n junction to a lower energy level and holes diffuse in the opposite direction, creating a negative charge on the emitter and a corresponding positive charge build-up in the base. In an alternate configuration, which has a p-type emitter region 102 and n-type base region 101 (FIG. 1), electrons diffuse across the p-n junction to form a positive charge on the emitter and holes diffuse in the opposite direction to form a negative charge build-up in the base. In either case, when an electrical circuit is made between the emitter and the base, a current will flow and electricity is produced by solar cell 100. The efficiency at which solar cell 100 converts incident energy into electrical energy is affected by a number of factors, including the recombination rate of electrons and holes in solar cell 100 and the fraction of incident light that is reflected off of solar cell 100.

Recombination occurs when electrons and holes, which are moving in opposite directions in solar cell 100, combine with each other. Each time an electron-hole pair recombines in solar cell 100, charge carriers are eliminated, thereby reducing the efficiency of solar cell 100. Recombination may occur in the bulk silicon of substrate 110 or on either surface 105, 106 of substrate 110. In the bulk, recombination is a function of the number of defects in the bulk silicon. On the surfaces 105, 106 of substrate 110, recombination is a function of how many dangling bonds, i.e., unterminated chemical bonds, are present on surfaces 105, 106. Dangling bonds are found on surfaces 105, 106 because the silicon lattice of substrate 110 ends at these surfaces. These unterminated chemical bonds act as defect traps, which are in the energy band gap of silicon, and therefore are sites for recombination of electron-hole pairs.

As noted above, one function of the dielectric passivation layer 104 is to minimize the carrier recombination at the surface of the emitter region(s) 102 or the base region 101 over which the dielectric passivation layer 104 is formed. It has been found that forming a negative charge in a dielectric passivation layer 104 disposed over a p-type doped region formed in a solar cell device can help repel the carriers moving through the solar cell, and thus reduce the carrier recombination and improve the efficiency of the solar cell device. While it is relatively easy to form a passivation layer that has a net positive charge using traditional plasma processing techniques, it is difficult to form a stable negatively charged passivation layer on the surface of a silicon substrate.

Thorough passivation of the surface of a solar cell greatly improves the efficiency of the solar cell by reducing surface recombination. In order to passivate a surface of solar cell 100, such as surface 105, a dielectric passivation layer 104 is typically formed thereon, thereby reducing the number of dangling bonds present on surface 105 by 3 or 4 orders of magnitude. For solar cell applications, dielectric passivation layer 104 is generally a silicon nitride ($Si_xN_y$ or abbreviated SiN) layer, and the majority of dangling bonds are terminated with silicon (Si), nitrogen (N), or hydrogen (H) atoms. But because silicon nitride (SiN) is an amorphous material, a perfect match-up between the silicon lattice of emitter region 102 and the amorphous structure of dielectric passivation layer 104 cannot occur. Hence, the number dangling bonds remaining on surface 105 after the formation of dielectric passivation layer 104 is still enough to significantly reduce the efficiency of solar cell 100, requiring additional passivation of surface 105, such as hydrogen passivation. In the case of multi-crystalline silicon solar cells, hydrogen also helps to passivate the defect centers on the grain boundary.

During normal processing of the solar cell device the p-type boron doped regions found in the solar cell may form an oxide layer, such as boron silicate glass (BSG) layer that is hard to remove prior to forming the dielectric passivation layer 104. The BSG oxide layer may be formed over the back side of a p-type substrate base region 101, or, alternately, the BSG layer may be formed over a p-type emitter structure. However, it is generally important to remove the formed oxide layer and clean the substrate surface to prevent contamination of the solar cell substrate during subsequent processing and improve the passivating effect of the dielectric passivation layer that is later formed over the substrate surface.

It is also desirable to assure that the solar cell efficiently converts as much of the optical energy received by the sun into electrical energy as possible. However, since sunlight may be scattered, refracted, diffracted, or reflected fairly easily, several different techniques have been developed to enhance light trapping in the solar cells to improve conversion efficiency. For example, a surface texture may be provided to increase the surface roughness, thereby assisting the light to be trapped and confined in the solar cell. Conventional surface texturing processes often utilize aqueous alcohol related compounds as a chemical source for substrate surface treatment. However, alcohol related compounds are flammable, which are fire hazard and be in environmental safety concern, thereby requiring special safety measures during processing. Also, alcohols evaporate at the temperatures needed to assure that the chemical activity of the etchants in the texturing solution is in an optimum range to effectively perform the texturing process. Evaporation of the alcohol components from the texturing bath thus leads to an unstable texturing bath composition when the processes are run at these elevated temperatures.

Therefore, there is a need for an improved method of cleaning a substrate prior to depositing a passivation layer, an improved method of forming a desirable charge at the surface of the solar cell device to minimize surface recombination of the charge carriers, and there is a need for a method to form a desirable surface texture on a surface of a solar cell to improve the formed cell's ability to trap incident light.

SUMMARY OF THE INVENTION

Embodiments of the present invention generally provide a method of passivating a surface a solar cell substrate, comprising exposing a surface of a p-type doped region formed on a substrate to a first RF plasma that comprises a first processing gas and a first fluorine containing gas, and exposing the surface of the p-type doped region to a second RF plasma that comprises a halogen gas, and RF biasing the substrate to form a negatively charged layer on the surface of the p-type doped region.

Embodiments of the present invention may further provide a method of passivating a surface a solar cell substrate, comprising exposing a surface of a p-type doped region formed on an n-type substrate to a first RF plasma that comprises a first processing gas and a first fluorine containing gas, exposing the surface of the p-type doped region to a second RF plasma that comprises a second processing gas, a second fluorine containing gas and hydrogen containing gas, exposing the surface of the p-type doped region to a third RF plasma that comprises a halogen gas, and RF biasing the substrate to form a negatively charged layer on the surface of the p-type doped region, and depositing a first silicon nitride-containing layer on the formed negatively charged layer.

Embodiments of the present invention may further provide a method of passivating a surface a solar cell substrate, comprising removing an oxide layer from a surface of a p-type doped region formed on a substrate, removing a portion of the surface of the substrate that has a concentration of p-type atoms that is greater than the average concentration of the p-type atoms in the p-type doped region, and forming a negatively charged layer on the surface by exposing the surface to an RF plasma comprising fluorine or chlorine.

Embodiments of the present invention may further provide a method of cleaning a processing surface a solar cell substrate, comprising removing an oxide layer from a processing surface of a p-type doped region formed on a substrate, removing a dead region from the processing surface of the substrate, and forming a negatively charged layer on the processing surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 2A-2D depicts cross-sectional views of a portion of a substrate corresponding to various stages of the process illustrated in FIG. 3 according to one or more embodiments of the invention.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
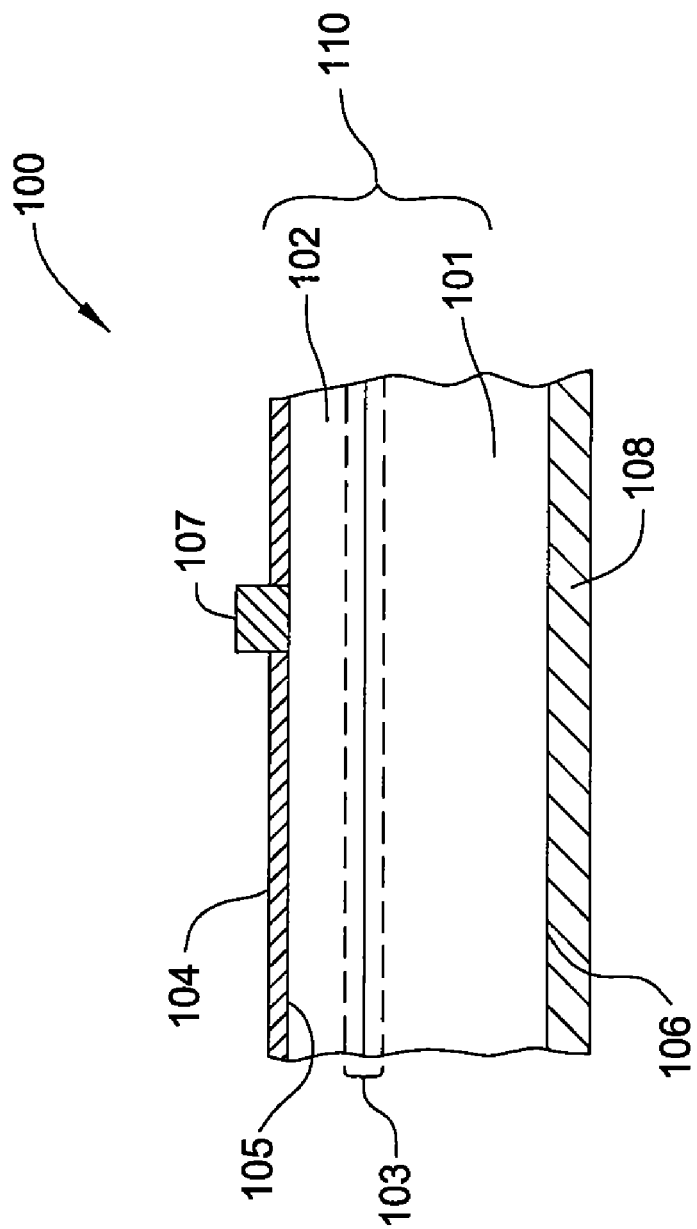
FIG. 1 schematically depicts a cross-sectional view of a standard silicon solar cell fabricated from a single or multi-crystalline silicon wafer.

The present invention generally provides a method of preparing a surface of a silicon substrate and forming at least a portion of a high quality passivation layer which is part of a formed high efficiency solar cell device. Embodiments of the present invention may be especially useful for preparing a surface of a p-type doped region formed in a silicon substrate, so that a high quality passivation layer structure can be formed thereon. In one embodiment, the methods include exposing a surface of the solar cell substrate to a plasma to clean and modify the physical, chemical and/or electrical characteristics of the surface. Solar cell substrates that may benefit from the invention include substrates that have an active region that contains single crystal silicon, multi-crystalline silicon, and polycrystalline silicon, but may also be useful for substrates comprising germanium (Ge), gallium arsenide (GaAs), cadmium telluride (CdTe), cadmium sulfide (CdS), copper indium gallium selenide (CIGS), copper indium selenide ($CuInSe_2$), gallium indium phosphide ($GaInP_2$), organic materials, as well as heterojunction cells, such as GaInP/GaAs/Ge or ZnSe/GaAs/Ge substrates, that are used to convert sunlight to electrical power.

Embodiments of the invention may also generally provide a method of cleaning and forming a negative charge containing layer on one or more surfaces of a substrate, such as a surface of a doped p-type region. A negative charge containing layer that is formed over a p-type region is generally used to repel the electrons flowing in the solar cell device and passivate the surface to minimize carrier recombination and improve the efficiency of the formed solar cell device.

FIGS. 2A-2D illustrate schematic cross-sectional views of a solar cell substrate 210 during different stages in a processing sequence used to form a charged layer 219 and a passivation layer 220 on a surface (e.g., front surface 205) of a solar cell 200. In one embodiment, the charged layer 219 and a passivation layer 220 are used together to form high quality passivation layer structure on the solar cell's surface. FIG. 3 illustrates a process sequence 300 used to form the passivation layer on a solar cell substrate 210. The sequences found in FIG. 3 correspond to the stages depicted in FIGS. 2A-2D, which are discussed herein.

Figure 2A:
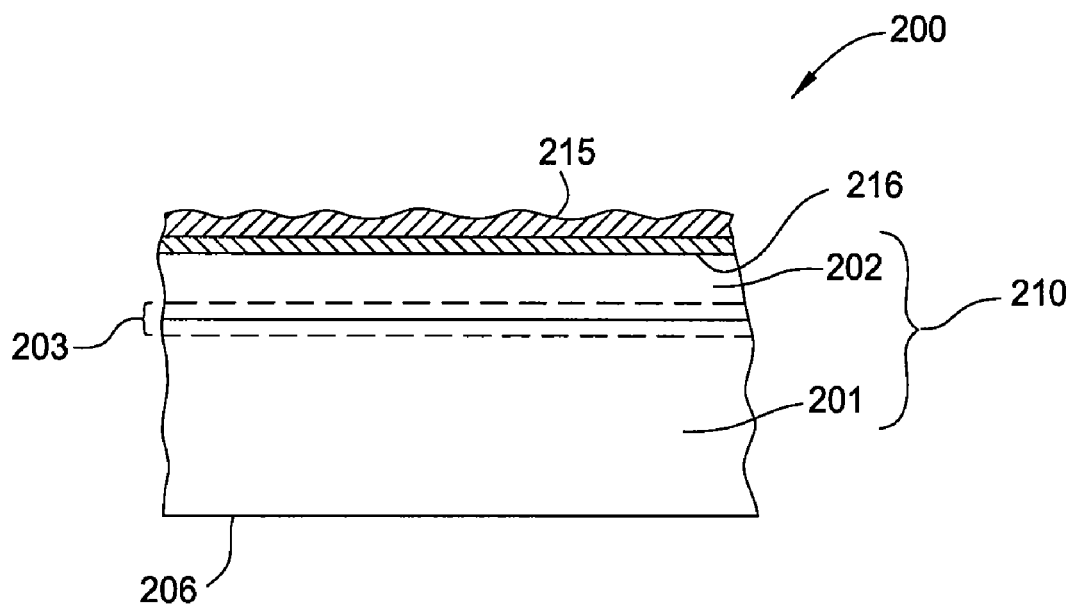
Figure 3:
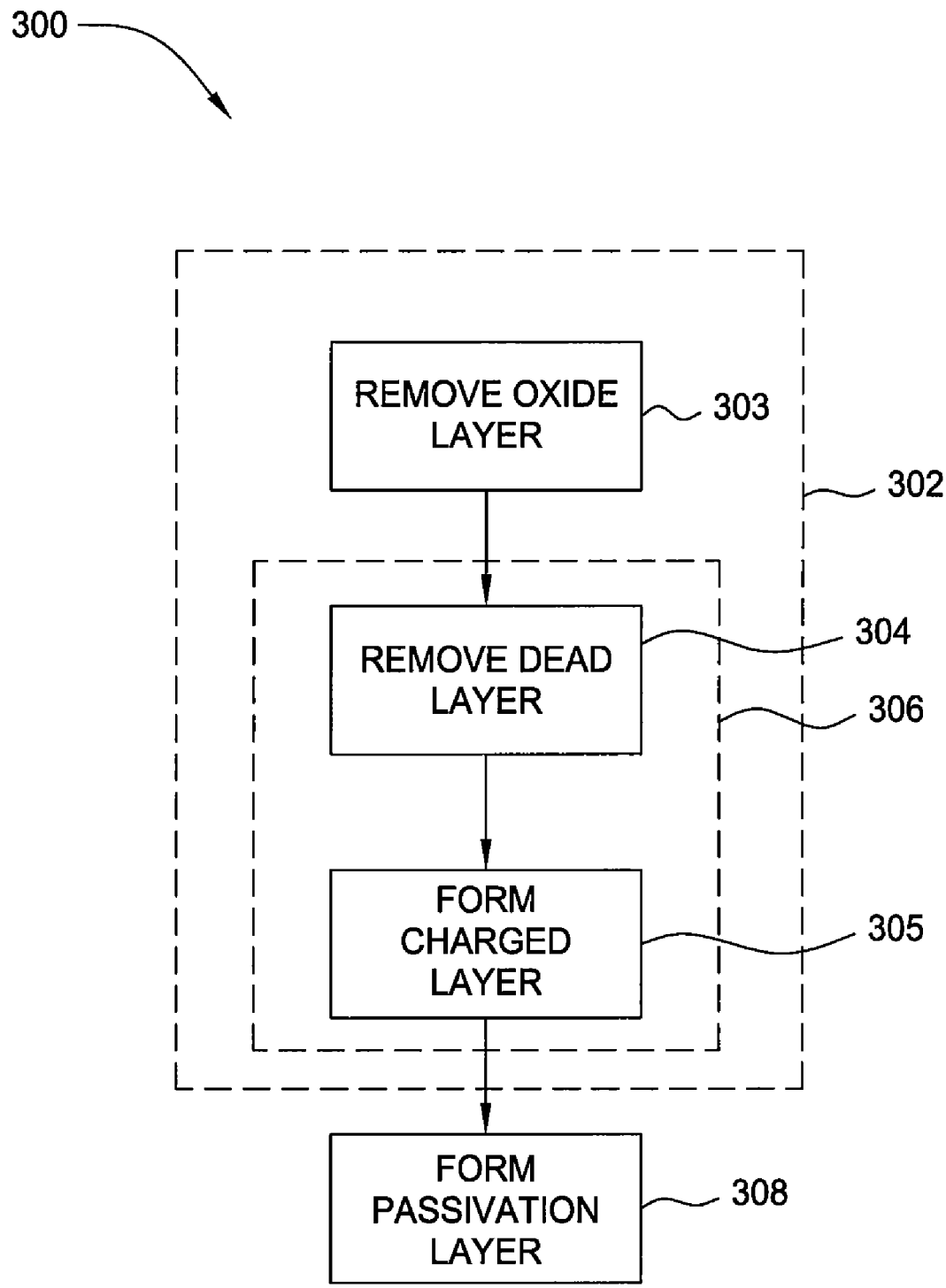
FIG. 3 depicts a process flow diagram of a passivation layer formation process performed on a silicon substrate in accordance with one embodiment of the invention.

FIG. 2A schematically illustrates a cross-sectional view of an at least partially formed silicon solar cell 200 that comprises a substrate 210. The substrate 210 includes a base region 201, an emitter region 202, and a p-n junction region 203. The p-n junction region 203 is disposed between base region 201 and emitter region 202 of the solar cell, and is the region in which electron-hole pairs are generated when solar cell 200 is illuminated by incident photons of light.

As noted above, during normal processing of a solar cell device a thin and generally poor quality native oxide layer 215 will form on one or more of the surfaces of the substrate 210. In configurations where the native oxide layer 215 is formed over a p-type boron doped region, the oxide layer 215 may comprise a boron silicate glass (BSG) containing layer. In one example, the BSG containing oxide layer is formed over a p-type emitter region(s) 202 formed over an n-type base region 201 (FIG. 2A). In an alternate example, the BSG type oxide layer is formed over the back side of a p-type substrate base region 201. The thickness and density of the formed oxide layer 215 will depend on how the layer was formed, since in some cases the oxide layer may be formed during or after one or more thermal processing steps, such as a furnace anneal step that used to "drive-in" or anneal one or more layers formed on the substrate 210. In some cases the oxide layer may be formed by extended exposure to air.

Further, it is common for a partially formed solar cell device to also have a dead region 216, which contains a high concentration of dopant atoms, formed at the interface between the oxide layer 215 and the surface of the substrate 210. The high dopant concentration in the dead region 216 is believed to be created by the diffusion of dopant atoms to the surface 205 of the substrate 210 during prior doping or thermal processing steps. In one example, the dead region 216 contains a high concentration of boron atoms (e.g., >0.1%) at the surface of a silicon containing p-type doped emitter region 202. In one example, the dead region 216 formed in a silicon substrate contains less than 85% electrically active boron. A p-type dead region contains a higher concentration of p-type atoms than the average concentration of p-type atoms in the p-type portion of the substrate below, such as the p-type doped emitter region 202. In one embodiment, the dead region 216 has a doping concentration high enough to form a region that has a resistivity of less than about 50 Ohm-cm. In general, it is hard to remove these boron doped layers using conventional processing techniques, which may include wet chemical etching processes. However, it is generally important to perform the cleaning to remove the boron rich layers, which contain a high concentration of defects and contaminants, which decrease the degree of passivation of the interface. These defects may include dislocations, grain boundaries, dangling bonds, and voids; and the contaminants may include oxygen, silicon and metallic oxides, and metallic impurities from the bulk Si or from the processing itself.

Referring to FIG. 2A, in one embodiment of the solar cell 200, the base region 201 comprises an n-type crystalline silicon substrate, and the emitter region 202 comprises a p-type layer formed over the base region 201. While the discussion below primarily discusses a method and apparatus for processing a substrate having a p-type emitter region formed over an n-type base region this configuration is not intended to limit the scope of the invention described herein.

At box 302, the surfaces of the substrate 210 is cleaned to remove the oxide layer 215 (FIG. 2A) and dead region 216 (FIG. 2A), and form a charged layer 219 (FIG. 2B) on the surfaces of the substrate. The processes performed at box 302 may be performed in a single processing step performed in one substrate processing chamber, or as multiple separate process steps performed in one or more substrate processing chambers. In one embodiment, as shown in FIG. 3, the cleaning process performed at box 302 includes: 1.) a first cleaning process performed at box 303 that is used to remove the oxide layer 215, 2.) a second cleaning process performed at box 304, that is used to remove the dead region 216, and 3.) a charged layer 219 formation process performed at box 305. In one embodiment, a substrate 210 may be processed in a cluster tool, such as system 500 (FIG. 5), in which one or more of the processing chambers are used to remove the oxide layer 215, remove the dead region 216, and form a charged layer 219.

In one embodiment, the first clean process performed at box 303 may be performed using a batch wet cleaning process in which the substrate 210 is exposed to a cleaning solution. In this case, the substrates are cleaned using a wet cleaning process in which they are sprayed, flooded, or immersed in a cleaning solution. The clean solution may be an SC1 cleaning solution, an SC2 cleaning solution, HF-last cleaning solution, ozonated water solution, hydrofluoric acid (HF) and hydrogen peroxide ($H_2O_2$) solution, or other suitable and cost effective cleaning solution. The cleaning process may be performed on the substrate in a room temperature bath for between about 5 seconds and about 600 seconds, such as about 30 seconds to about 240 second, for example about 120 seconds.

In an alternate embodiment, the clean process performed at box 303 may be performed using a dry cleaning process in which the substrate 210 is exposed to a reactive plasma etching process to remove the oxide layer 215. An example of a dry cleaning process and dry processing chamber are further described below in conjunction with FIGS. 4 and 5.

Next, at box 304, the dead region 216 is removed from the surfaces of the substrate 210 by use of a dry cleaning process. In one embodiment, after removing oxide layer 215 from a surface of the substrate 210 the substrate is then delivered to a dry processing chamber to remove the dead region 216. In general, the dry cleaning process performed at box 304 generally includes exposing the dead region 216 to an RF or microwave plasma for a desired period of time to remove a portion of the substrate surface. In one example of the processes performed at box 304, the surface of a silicon substrate (e.g., crystalline silicon substrate) is etched until the surface of the etched region contains at least 85% electrically active boron, and thus the p-type dead region 216 is substantially removed. An example of such a dry processing chamber and dry cleaning process is further described below in conjunction with FIGS. 4 and 5. One will note that in some cases, it may desirable to assure that the substrate is not exposed to oxygen for extended periods of time after performing the cleaning process performed at box 303 before the cleaning process performed at box 304 is performed on the substrate to prevent the re-oxidation of the cleaned surface. Therefore, in some embodiments of the invention, it is desirable to perform all of the processes performed at boxes 302-308 in an oxygen-free inert and/or vacuum environment, such as in the vacuum processing regions of a cluster tool, or system 500 (FIG. 5), so that the substrate is not exposed to oxygen between the process steps.

Figure 2B:
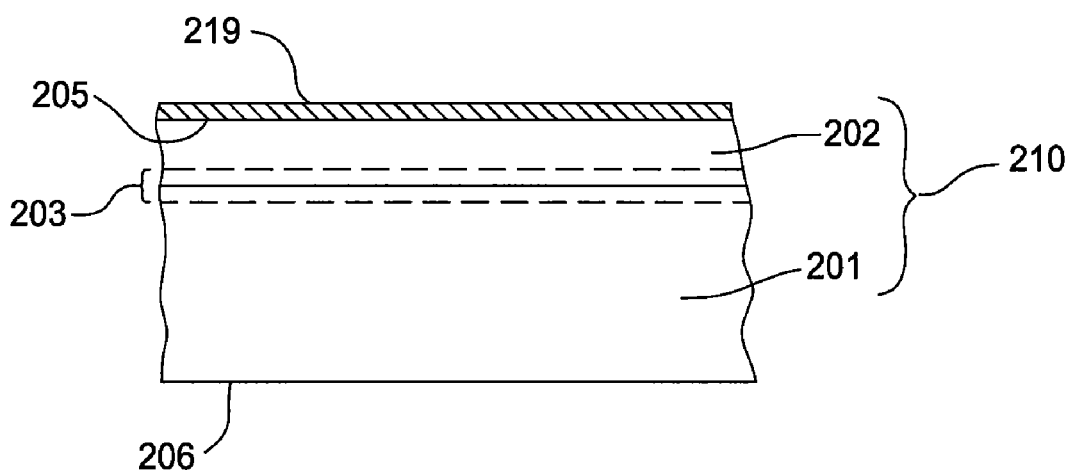

At box 305, as shown in FIGS. 2B and 3, the surface 205 of the substrate 210 is exposed to a reactive gas containing RF plasma that is used to form a negatively charged layer 219 thereon. In one embodiment, the negatively charged layer 219 comprises a fluorine (F) rich, and/or chlorine (Cl) rich, layer that is less than about 50 Angstroms (Å) thick. It is believed that by exposing the cleaned surface, such as surface 205, directly to a plasma containing ionized fluorine, and/or ionized chlorine, the exposed surface can be "doped", "stuffed" or covered with a fluorine rich, or chlorine rich, layer that has a negative charge. In one embodiment, it is desirable for a charged layer 219 that is formed on a silicon containing surface to have a density of negative charge greater than about $1 \times 10^{12}$ Coulombs/cm$^2$. An example of a charge layer formation process is further described below in conjunction with FIGS. 4 and 5. While the deposited charged layer 219 will generally contain a desirable charge density, the charged layer 219 also needs to be physically, chemically and electrically stable enough to allow one or more passivation or anti-reflection layer coatings (ARC) to be formed thereon using a PECVD process without significantly degrading the properties of the formed charged layer 219.

In one embodiment of the process performed at box 305, the surface 205 of the substrate 210 is sputtered etched during one or more parts of the charged layer 219 formation process to help add, or form, surface texture on the surface 205. In general, this process may include generating a plasma containing an inert gas to sputter a surface of the substrate disposed on a biased or grounded substrate support.

In one embodiment, the cleaning process performed at box 304 and the charged layer 219 formation process, performed at box 305, are completed as one continuous process, or the process performed at box 306. Therefore, in one embodiment, the plasma chemistry used in at least one portion of the cleaning process performed at box 304 contains a fluorine, or chlorine, containing gas, which is used to form the charged layer 219 on the surface of the substrate.

In another embodiment, the cleaning processes performed at boxes 303 and 304 and the charged layer 219 formation process performed at box 305 are completed as one continuous process, such as the process performed at box 302. Therefore, in one embodiment, the plasma chemistry used in at least one portion of the cleaning process performed at box 303 and/or at least one portion of the cleaning process performed at box 304, contains a fluorine, or chlorine, containing gas, which is used to form the charged layer 219 on the surface of the substrate.

Next, at box 308, as shown in FIGS. 2C-2D and 3, a passivation layer 220 is formed on the charged layer 219 using a plasma enhanced chemical vapor deposition (PECVD) process. In one embodiment, the passivation layer 220 comprises a plurality of passivation layers, such as passivation layers 221 and 222, which are used to passivate the surface of the substrate. In one embodiment, the passivation layer 220 comprises a thin passivation and/or antireflection layer that comprises silicon oxide, silicon nitride, amorphous silicon, amorphous silicon carbide and/or aluminum oxide ($Al_2O_3$). In one embodiment, a silicon nitride (SiN) passivation and antireflection layer, or thin amorphous silicon (a-Si:H) layer or amorphous silicon carbide (a-SiC:H) layer and silicon nitride (SiN) stack is formed over the surface 205 using a chemical vapor deposition (PECVD) technique on multiple solar cell substrates supported on a suitable large area substrate carrier. In one embodiment, the passivation layer 220 may comprise an intrinsic amorphous silicon (i-a-Si:H) layer and/or p-type amorphous silicon (p-type a-Si:H) layer stack followed by a transparent conductive oxide (TCO) layer and/or an ARC layer (e.g., silicon nitride), which can be deposited by use of a physical vapor deposition process (PVD) or chemical vapor deposition process (e.g., PECVD). The formed stack is generally configured to generate a front surface field effect to reduce surface recombination and promote lateral transport of electron carriers to nearby doped contacts formed on the substrate. An example of a passivation layer formation process is further described below.

Hardware Configuration

Figure 4:
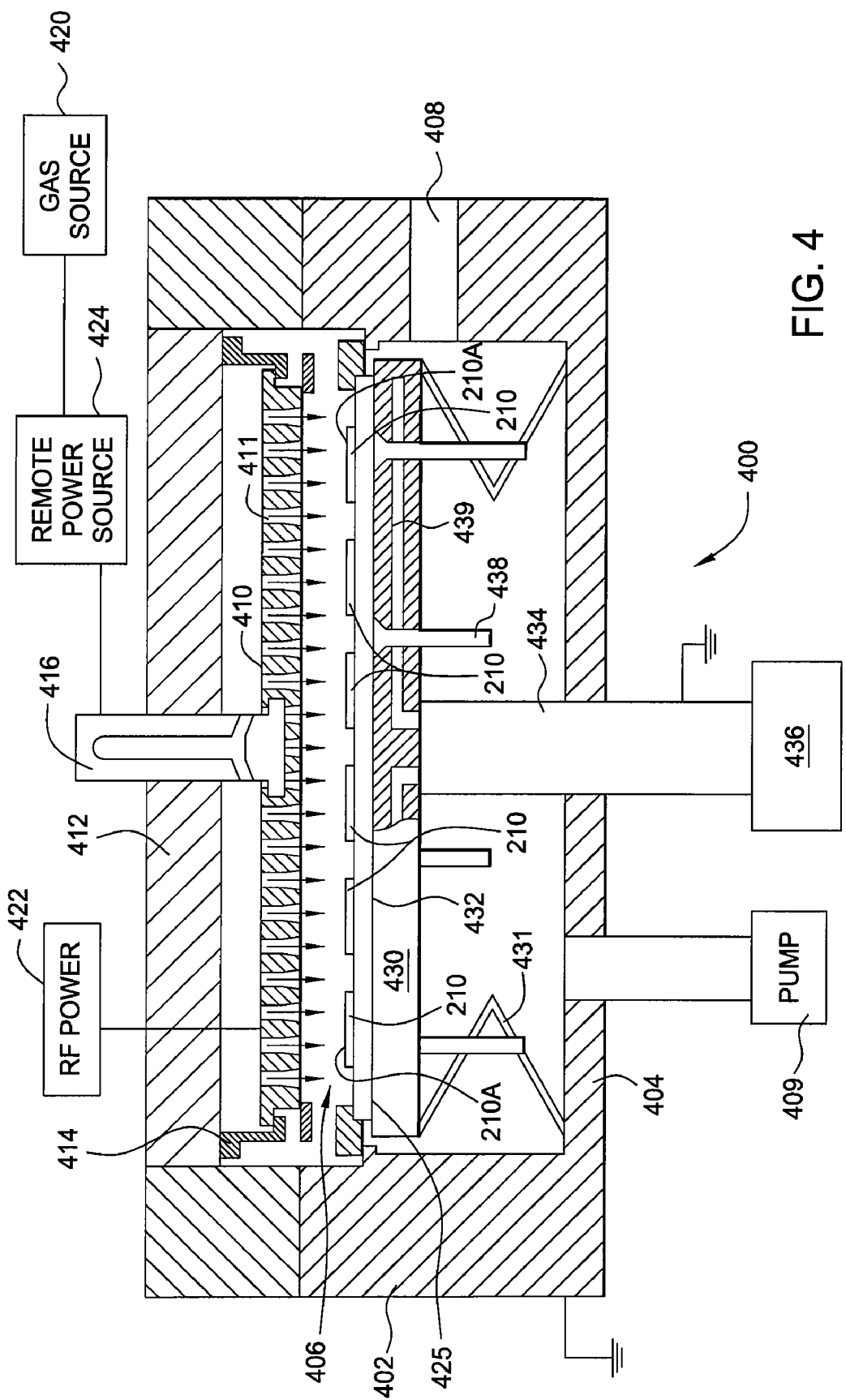
FIG. 4 is a schematic side view of a parallel plate PECVD system that may be used to perform embodiments of the invention.

FIG. 4 is a schematic cross-section view of one embodiment of a plasma enhanced chemical vapor deposition (PECVD) chamber 400 in which one or more of the processes illustrated and discussed in conjunction with FIG. 3 may be performed. A similarly configured plasma enhanced chemical vapor deposition chamber is available from Applied Materials, Inc., located in Santa Clara, Calif. It is contemplated that other deposition chambers, including those from other manufacturers, may be utilized to practice the present invention.

It is believed that the plasma processing configuration provided in the processing chamber 400 has significant advantages over other prior art configurations when used to perform one or more of the processes described in FIG. 3. As noted above, in one embodiment, the plasma enhanced chemical vapor deposition (PECVD) process chamber 400 is adapted to simultaneously process a plurality of substrates. In one configuration, a batch of solar cell substrates is simultaneously transferred in a controlled environment, such as a vacuum or an inert environment (e.g., transfer chamber 520) to prevent substrate contamination and improve substrate throughput over other prior art configurations.

Figure 5:
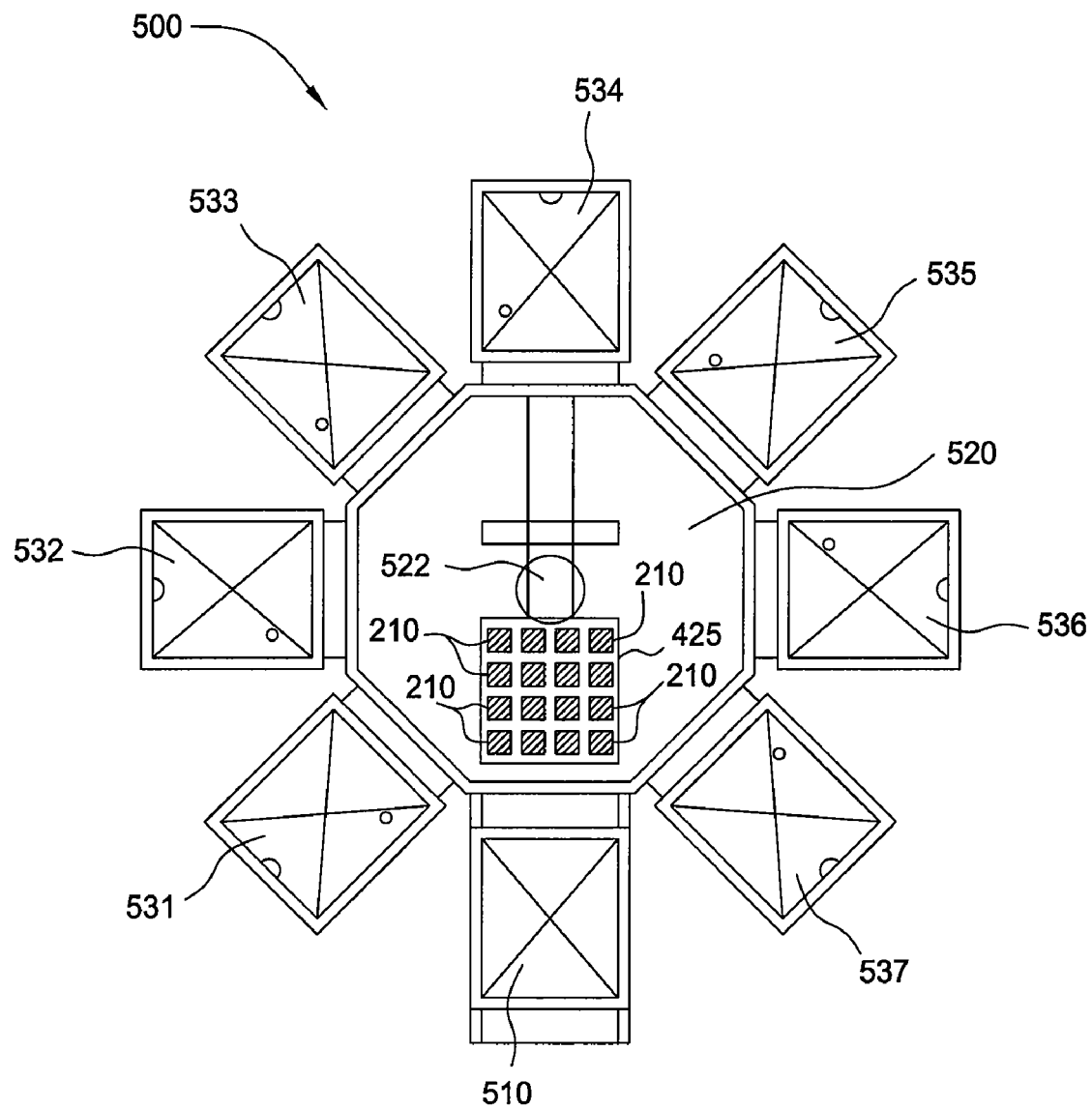
FIG. 5 is a top schematic view of one embodiment of a process system having a plurality of process chambers according to one embodiments of the invention.

Also, as illustrated in FIG. 5, in the various embodiments of the present invention, each batch of substrates 210 are arranged in a planar array for processing as opposed to processing vertical stacks of substrates (e.g., batches of substrates stacked in cassettes). Processing the batches of substrates arranged in a planar array allows each of the substrates in the batch to be directly and uniformly exposed to the generated plasma, radiant heat, and/or processing gases. Therefore, each substrate in the planar array is similarly processed in the processing region of a processing chamber, and thus does not rely on diffusion type processes and/or the serial transfer of energy to all substrates in a conventionally configured batch that is being processed, such as a stacked or back-to-back configured batch of substrates commonly found in the prior art.

In one embodiment, the PECVD chamber 400 is configured to process a plurality of substrates at one time. In one configuration, the PECVD chamber 400 is adapted to accept a substrate carrier 425 (FIGS. 4 and 5) that is configured to hold a batch of substrates during the transferring and substrate processing steps. In one embodiment, the substrate carrier 425 has a surface area of about 10,000 cm$^2$ or more, that is configured to support a planar array of substrates disposed thereon during processing. In one embodiment, the substrate carrier 425 has a plurality of recesses (not shown) formed therein that are adapted to hold between about 4 and about 49 solar cell substrates that are 156 mm×156 mm×0.3 mm in size in a face-up or face-down configuration. The substrate carrier 425 may be formed from a ceramic (e.g., silicon carbide, alumina), graphite, metal or other suitable material.

The chamber 400 generally includes walls 402, a bottom 404, and a showerhead 410, and substrate support 430 which define a process region 406. The processing region 406 is accessed through a valve 408 such that the substrates disposed on the substrate carrier 425, may be transferred in and out of the chamber 400. The substrate support 430 includes a substrate receiving surface 432 for supporting a substrate and stem 434 coupled to a lift system 436 to raise and lower the substrate support 430. A shadow from 433 may be optionally placed over periphery of the substrate carrier 425. Lift pins 438 are moveably disposed through the substrate support 430 to move the substrate carrier 425 to and from the substrate receiving surface 432. The substrate support 430 may also include an embedded heating and/or cooling elements 439 to maintain the substrate support 430 at a desired temperature. The substrate support 430 may also include grounding straps 431 to provide RF grounding at the periphery of the substrate support 430. Examples of grounding straps are disclosed in U.S. Pat. No. 6,024,044 issued on Feb. 15, 2000 to Law et al. and U.S. patent application Ser. No. 11/613,934 filed on Dec. 20, 2006 to Park et al., which are both incorporated by reference in their entirety to the extent not inconsistent with the present disclosure. In one embodiment, the substrate support 430 has an RF source (not shown) that is coupled to an electrode (e.g., reference numeral 439) that is embedded in the substrate support 430 so that an RF bias can be applied to the substrates 210 disposed over the substrate support 430.

The showerhead 410 is coupled to a backing plate 412 at its periphery by a suspension 414. The showerhead 410 may also be coupled to the backing plate by one or more center supports 416 to help prevent sag and/or control the straightness/curvature of the showerhead 410. In one configuration, the substrate support 430 and showerhead 410 are generally parallel to each other, and in some cases the surface of the showerhead 410 that contacts the processing region 406 may be slightly curved, such as concave or convex. A gas source 420 is coupled to the backing plate 412 to provide gas through the backing plate 412 and through the holes 411 formed in the showerhead 410 to the substrate receiving surface 432. A vacuum pump 409 is coupled to the chamber 400 to control the process region 406 at a desired pressure. An RF power source 422 is coupled to the backing plate 412 and/or to the showerhead 410 to provide a RF power to the showerhead 410 so that an electric field is created between the showerhead and the substrate support so that a capacitively coupled plasma may be generated using the gases disposed between the showerhead 410 and the substrate support 430. Various RF frequencies may be used, such as a frequency between about 0.3 MHz and about 200 MHz. In one embodiment the RF power source is provided at a frequency of 13.56 MHz. Examples of showerheads are disclosed in U.S. Pat. No. 6,477,980 issued on Nov. 12, 2002 to White et al., U.S. Publication 20050251990 published on Nov. 17, 2006 to Choi et al., and U.S. Publication 2006/0060138 published on Mar. 23, 2006 to Keller et al, which are all incorporated by reference in their entirety to the extent not inconsistent with the present disclosure. It is believed that the direct contact of the capacitively coupled plasma to the processing surface 210A (FIG. 4) of the substrates 210 has advantages over designs that do not directly expose all of the substrates to the plasma, due to the ability of the chamber 400 configuration to provide energetic and/or ionized species directly to all parts of the processing surface 210A during processing. The degree of plasma interaction applied to the complete processing surface 210A can be directly controlled in the chamber 400 by adjusting the RF power delivered to the showerhead 410, the chamber pressure during processing, and/or the bias applied to the substrate support 430. Typical non-direct exposure type chamber configurations include remotely driven plasma configurations or other stacked wafer configurations that rely on the diffusion of the generated plasma to one or more of the substrates, or parts of each of the substrates, during processing.

However, in some embodiments, a remote plasma source 424, such as an inductively coupled remote plasma source, may also be coupled between the gas source and the backing plate. In one process configuration, between processing substrates, a cleaning gas may be provided to the remote plasma source 424 so that a remote plasma is generated and provided to clean chamber components. The cleaning gas may be further excited by the RF power source 422 provided to the showerhead. Suitable cleaning gases include but are not limited to $NF_3$, $F_2$, and $SF_6$. Examples of remote plasma sources are disclosed in U.S. Pat. No. 5,788,778 issued Aug. 4, 1998 to Shang et al, which is incorporated by reference to the extent not inconsistent with the present disclosure.

In one embodiment, the heating and/or cooling elements 439 may be set to provide a substrate support temperature during deposition of about 400° C. or less, preferably between about 100° C. and about 400° C., more preferably between about 150° C. and about 300° C., such as about 200° C. The spacing during deposition between the top surface of a substrate disposed on a substrate carrier 425 disposed on the substrate receiving surface 432 and the showerhead 410 may be between 400 mil and about 1,200 mil, preferably between 400 mil and about 800 mil.

FIG. 5 is a top schematic view of one embodiment of a processing system, or system 500, having a plurality of process chambers 531-537, such as PECVD chambers chamber 400 of FIG. 4 or other suitable chambers capable of performing the processes described in conjunction with FIG. 3. The system 500 includes a transfer chamber 520 coupled to a load lock chamber 510 and the process chambers 531-537. The load lock chamber 510 allows substrates to be transferred between the ambient environment outside the system and vacuum environment within the transfer chamber 520 and process chambers 531-537. The load lock chamber 510 includes one or more evacuatable regions that is configured to hold one or more substrate carriers 425 that are configured to support a plurality of substrates 210. The evacuatable regions are pumped down during the input of the substrates into the system 500 and are vented during the output of the substrates from the system 500. The transfer chamber 520 has at least one vacuum robot 522 disposed therein that is adapted to transfer the substrate carriers 425 and substrates between the load lock chamber 510 and the process chambers 531-537. Seven process chambers are shown in FIG. 5; however, the system 500 may have any suitable number of process chambers.

In one embodiment of system 500, a first processing chamber 531 is configured to perform the first clean process performed at box 303, a second process chamber 532 is configured to perform the process performed at box 304, a third process chamber 533 is configured to perform the process performed at box 305, and a fourth process chamber is configured to perform the process performed at box 308 on the substrates. In another embodiment of system 500, a first processing chamber 531 is configured to perform the first clean process performed at box 303, a second process chamber 532 is configured to perform the process performed at box 306, and a third process chamber 533 is configured to perform the process performed at box 308 on the substrates. In yet another embodiment of system 500, a first processing chamber 531 is configured to perform the process performed at box 302 and a second process chamber 532 is configured to perform process the process performed at box 308 on the substrates. In yet another embodiment of system 500, at least one of the process chambers 531-537 is configured to perform process the process performed at box 302 and process the process performed at box 308 on the substrates.

Clean Processes

Referring back to FIG. 3, during the first part of the process sequence 300 the surfaces of the substrate 210 are subjected to a plurality of processing steps that are used to remove the oxide layer 215, remove the dead region 216, and form a charged layer 219 on the surfaces of the substrate. The following are illustrative examples of one or more of the processes performed at boxes 302-308 that may be performed in a processing chamber, similar to process chamber 400 discussed above. The processes described below generally include methods of preparing a surface of a substrate using primarily dry processing techniques performed in one or more process chambers (e.g., process chamber 400) found in one or more cluster tools, such as systems 500.

As noted above, during prior processing steps or exposure to oxygen a substrate 210 may acquire an oxide layer 215 and a dead region 216 may be formed. In many embodiments, this will occur after formation of the last layer of a solar cell junction, such as a p-type or n-type doped layer. In other embodiments, this will occur prior to forming one or more conductor layers, such as after a heavily doped, or degeneratively doped, p-type layer is formed. It should be noted that while the various embodiment of the invention described herein are discussed in relation to cleaning a surface of a deposited layer, such as the emitter region 202, this configuration is not intended to limit the scope of the invention, since the apparatus and cleaning process(es) described herein can be used during any phase of the solar formation process without deviating from the basic scope of the invention described herein.

In one embodiment, at box 303, after disposing one or more of the substrates 210, which are on a substrate carrier 425 positioned on the support 430 in a process chamber 400, the oxide layer 215 is exposed to a reactive gas to form a thin film (not shown) on the oxide layer 215. The reactive gas may comprise nitrogen, fluorine, and hydrogen. In some embodiments, the reactive gas comprises radicals containing nitrogen, fluorine, or both, and is provided to the process chamber having the substrate disposed therein and directed toward the substrate. The thin film generally comprises a solid compound formed by reaction of the radicals with oxygen from the oxide layer 215.

Next, the thin film formed on the oxide layer 215 is thermally treated to remove it from the surface of the substrate. In some embodiments, the thermal treatment may be an annealing process performed in the processing chamber 400, or another adjacent chamber found in the system 500. During this step the thin film sublimes away from the substrate surface, taking oxygen and other impurities, and leaving a hydrogen-terminated layer (not shown) behind. In some embodiments, the hydrogen-terminated layer may also have traces of fluorine atoms in the formed hydrogen-terminated layer. Preferably, a temperature of about 75° C. or higher is used to cause the sublimation of the created thin film.

An exemplary reactive cleaning process for removing native oxides on a surface of the substrate using an ammonia ($NH_3$) and nitrogen trifluoride ($NF_3$) gas mixture performed within a processing chamber will now be described. The reactive cleaning process begins by placing a substrate into a processing chamber. During processing, the substrate may be cooled below about 65° C., such as between about 15° C. and about 50° C. Typically, the substrate support is maintained below about 22° C. to reach the desired substrate temperatures. In some embodiments, it is useful to maintain a temperature of the substrate below a temperature of the chamber walls during formation of the thin film to prevent condensation of reactive species from the reactive gas on the chamber walls.

A precursor gas mixture comprising ammonia gas and nitrogen trifluoride gas is introduced into the process chamber to form a cleaning gas mixture. The amount of each gas introduced into the chamber is variable and may be adjusted to accommodate, for example, the thickness of the oxide layer to be removed from the substrates, the geometry of the substrates being cleaned, the volume capacity of the reactive gas mixture and the volume capacity of the chamber body. In one aspect, the gases are added to provide a precursor gas mixture having at least a 1:1 molar ratio of ammonia to nitrogen trifluoride. In another aspect, the molar ratio of the gas mixture is at least about 3 to about 1 (ammonia to nitrogen trifluoride). Preferably, the gases are introduced in the dry etching chamber at a molar ratio of between about 1:1 (ammonia to nitrogen trifluoride) and about 30:1, more preferably, between about 5:1 (ammonia to nitrogen trifluoride) and about 10:1.

A purge gas or carrier gas may also be added to the precursor gas mixture. Any suitable purge/carrier gas may be used, such as argon, helium, hydrogen, nitrogen, forming gas, or mixtures thereof. Typically, the volume fraction of ammonia and nitrogen fluoride in the precursor gas mixture ranges from about 0.05% to about 20%. The remainder of the precursor gas mixture may be the carrier gas. In one embodiment, the purge or carrier gas is first introduced into the chamber body before the reactive gases to stabilize the pressure within the chamber body.

The operating pressure within the chamber body can vary. The pressure may be maintained within a range from about 500 mTorr to about 30 Torr, preferably from about 1 Torr to about 10 Torr, and more preferably from about 3 Torr to about 6 Torr, such as about 3 Torr. Dissociative energy is applied to the precursor gas mixture to form a reactive gas mixture. A RF power within a range from about 0.01 W/cm$^2$ to about 0.74 W/cm$^2$ may be applied to ignite a plasma of the precursor gas mixture within the plasma cavity (e.g., processing region 406 in FIG. 4). In one example, the frequency at which the RF power is applied is very low, such as less than about 100 kHz, and more preferably, within a range from about 50 kHz to about 90 kHz. In most embodiments, the surface of the substrate will be etched (i.e., converted into a thin film of anneal precursor) at a rate of between about 3 Å/sec and about 10 Å/sec, such as about 5 Å/sec.

The plasma energy dissociates the ammonia and nitrogen trifluoride gases into reactive species that combine to form a highly reactive ammonia fluoride ($NH_4F$) compound and/or ammonium hydrogen fluoride ($NH_4F$—HF) which reacts with the substrate surface. The gases dissociate to form charged and uncharged reactive species. In one embodiment, the carrier gas is first introduced into the dry etch chamber, a plasma of the carrier gas is generated, and then the reactive gases, ammonia and nitrogen trifluoride, are added to the plasma.

Not wishing to be bound by theory, it is believed that the etchant gas, $NH_4F$ and/or $NH_4F$—HF, reacts with the native oxide surface to form ammonium hexafluorosilicate (($NH_4$)$_2SiF_6$), ammonia ($NH_3$), and water ($H_2O$), while releasing oxygen gas ($O_2$). The ammonia and water are vapors at processing conditions and removed from the chamber by a vacuum pump attached to the chamber. A thin film of ammonium hexafluorosilicate is left behind on the substrate surface. The reaction mechanism can be summarized as follows:

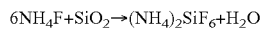

The thin film of ammonium hexafluorosilicate on the substrate surface may be removed to expose the underlying substrate surface during an anneal process. In one embodiment, the processing chamber radiates heat or provides an inert gas containing RF plasma to dissociate or sublimate the thin film of ammonium hexafluorosilicate into volatile $SiF_4$, $NH_3$, and HF products (e.g., $(NH_4)_2SiF_6$+heat.→$NH_3$+HF+$SiF_4$). These volatile products are then removed from the chamber by the vacuum pump attached to the system. In one example, a substrate temperature of about 75° C. or higher is used to effectively sublime and remove the thin film from the substrate. Preferably, a temperature of about 100° C. or higher is used, such a temperature within a range from about 115° C. to about 300° C., such as about 120° C. Higher temperature promotes faster sublimation. In one embodiment, the gas distribution plate is heated to a temperature of about 180° C. and spaced about 100 mils from the substrate to anneal the substrate. Once the film has been removed from the substrate, the chamber is purged and evacuated prior to removing the cleaned substrate. During the anneal process, the substrate may be maintained under vacuum, or may be exposed to hydrogen gas, or hydrogen gas or inert gas plasma, depending on the embodiment. Removal of the thin film removes oxygen from the substrate surface and deposits hydrogen, fluorine, or both on the substrate surface. In some embodiments, the anneal process may be performed on a side of the substrate opposite the side on which the cleaning film is deposited by use of heating elements found in the susceptor support. For example, if a first side of the substrate is subjected to the radical containing dry clean process described above, wherein a thin film is formed on the first side, a second side of the substrate, opposite the first side, may be heated to perform the anneal process.

In some embodiments of the process performed at box 304, it may be useful to supplement the process gas delivered during the process performed at box 303 with hydrogen ($H_2$) to subsequently remove the dead region 216. The addition of hydrogen to the process gas delivered during the process performed at box 303 promotes the concentration of hydrogen radicals and hydrogen fluoride in the reactive gas. The presence of these two species in the reaction mix will etch portions of doped silicon layers, such as the dead region 216, while the ammonium fluoride species form hexafluorosilicate on the surface of the substrate. This may improve cleaning, and may also effect removal of dopants from a surface of the substrate. Therefore, in some embodiments of the process performed at box 304, or the dead region 216 removal step, a molar ratio of $H_2$:$NH_3$ between about 0.1 and about 1.0 may be used to promote modest etching of the surface, with higher ratio causing more or faster etching. The molar ratio of hydrogen to ammonia in the reactive gas mixture controls the selectivity of the gas for etching doped silicon layers versus silicon oxide layers. Increasing the molar ratio of hydrogen to ammonia results in faster etching of the doped layer relative to the oxide layer, and vice versa. Addition of hydrogen may also allow selective etching of undoped silicon layers relative to oxide because the hydrogen forms HF in the reactive gas mixture, which etches undoped silicon layers.

Nitrogen and hydrogen gas may be substituted for ammonia in some embodiments. When dissociated, nitrogen and hydrogen may combine to form the ammonium radicals discussed above. Providing hydrogen and nitrogen in a molar ratio of about 3:1 will approximate the effect of ammonia at certain pressures and power levels. Varying the ratio may have beneficial side-effects, depending on the embodiment. For example, when cleaning a doped or heavily doped surface, a higher proportion of hydrogen may improve the etch rate of the doped surface by providing more hydrogen radicals to remove dopants.

Next, in the process performed at box 305, the substrate is exposed to a reactive gas containing RF plasma that is used to form a negatively charged layer 219 on the exposed surfaces of the substrates. In one example, the substrate is exposed to a 13.56 MHz RF plasma that contains an amount of a halogen gas. In one embodiment, the halogen gas is a fluorine gas or chlorine gas, which is provided from a gas comprising nitrogen trifluoride ($NF_3$), sulfur hexafluoride ($SF_6$), fluorine gas ($F_2$), chlorine gas ($Cl_2$), hydrochloric acid (HCl), dichlorodifluoromethane ($CCl_2F_2$), or fluorocarbons, such as $C_2F_2$, $CF_4$, $C_2F_4$, and $C_3F_6$. In one example, the halogen gas is diatomic fluorine gas ($F_2$). It is believed that by exposing the cleaned surface, such as surface 205, directly to a plasma containing ionized fluorine, and/or ionized chlorine, the exposed surface can be "doped", "stuffed" or covered with a fluorine rich layer, or chlorine rich layer, that has a negative charge. In some configurations, it is desirable to actively bias the substrate to "dope", "stuff" or cover the surface with the fluorine rich, or chlorine rich, layer that has a negative charge. In one example, by applying an RF bias to a showerhead 410 and grounding the substrate support 430 the ionized species found in the plasma can be driven to the surface of the substrates to "dope", "stuff" or cover the surface with the fluorine rich, or chlorine rich, layer that has a negative charge. In one example, the process performed at box 305 comprises delivering 1500 sccm/L of a fluorine ($F_2$) gas and 500 sccm/L of argon to achieve a chamber pressure of about 2000 mTorr, supplying about 0.6 mW/cm$^2$ of 13.56 MHz of RF power to showerhead for about 15 seconds to form a 3 to 10 angstrom (Å) thick charged layer 219 that has a charge density greater than about $1 \times 10^{12}$ charge/cm$^2$. In one embodiment, it is desirable to purge the process chamber and not flow a hydrogen containing gas into the processing region 406 during the process performed at box 305 to avoid the formation of certain types of etchants, such as hydrofluoric acid (HF), which can affect the deposition and properties of the formed charged layer 219.

Figure 6:
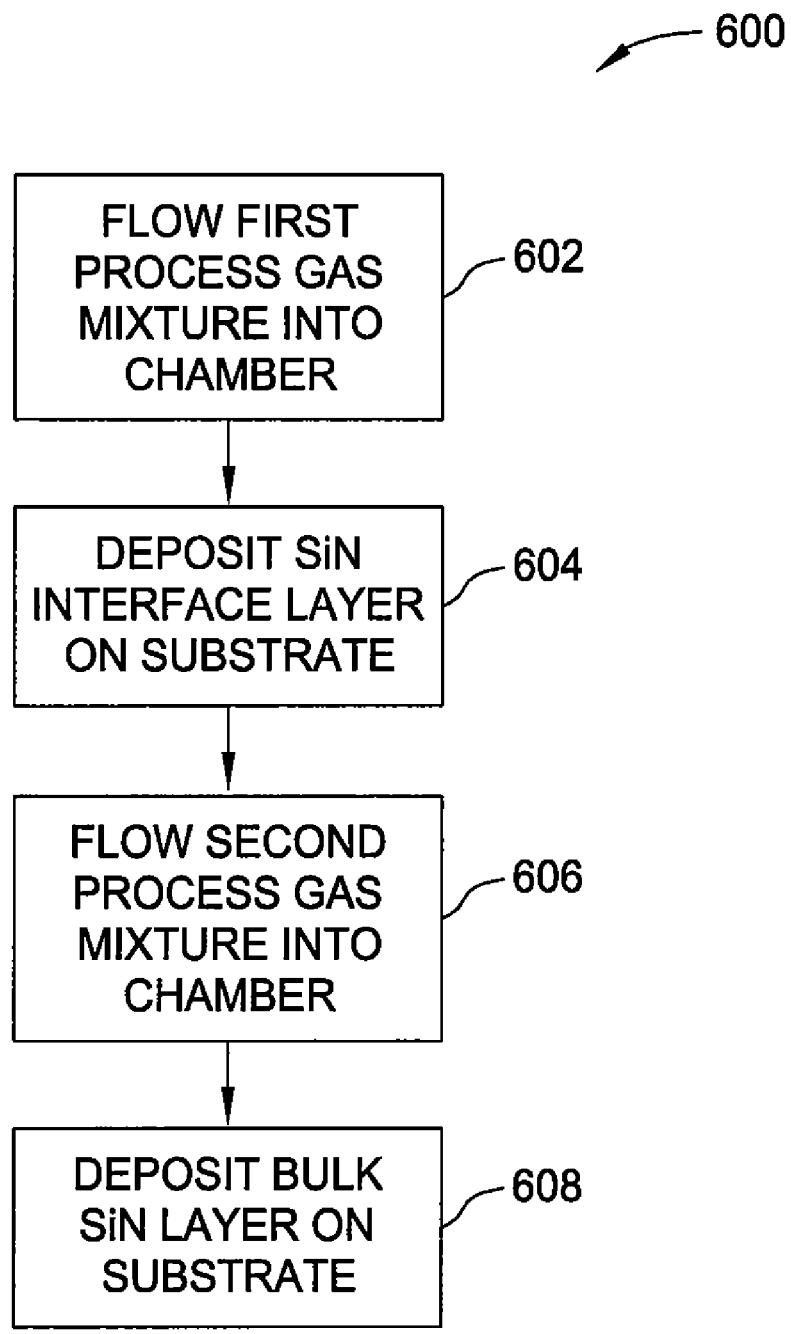
FIG. 6 depicts a process flow diagram of a passivation layer formation process performed on a silicon substrate in accordance with one embodiment of the invention.

Next, in the process performed at box 308, the substrate is exposed to a reactive gas containing RF plasma that is used to form a passivation layer, such as a multilayer hydrogenated SiN film on the substrates 210. FIG. 6 illustrates an exemplary process sequence 600 used to form the passivation layer deposited in box 308 on a solar cell substrate 210.

In one embodiment, at box 602, after the substrates 210 are positioned in another of the processing chambers 531-537 in the processing system 500, or, alternately, the same processing chamber used to form one or more of the prior steps, a process gas mixture is flowed into the chamber. The process gas mixture includes a precursor gas mixture and a hydrogen gas ($H_2$) diluent. The hydrogen gas diluent may have a flow rate as high as approximately two times the flow rate of the precursor gas mixture. The precursor gas mixture may be a combination of silane ($SiH_4$) and nitrogen ($N_2$), silane and ammonia ($NH_3$), or silane, ammonia, and nitrogen. In one example, flow rates for a first process gas mixture containing silane, ammonia, and hydrogen may be 3.5 sccm, 50 sccm, and 80 sccm, per liter of chamber volume, respectively. Alternately, flow rates for a first process gas mixture containing silane, ammonia, nitrogen, and hydrogen may be 5 sccm, 16 sccm, 40 sccm, and 80 sccm, per liter of chamber volume, respectively. The substrate support 430 temperature is generally maintained at a temperature of about 390° C. during this process step.

Next, at box 604, a plasma is then generated in the processing chamber to deposit a SiN layer on the substrates 210, wherein the SiN layer is suitable for use as a combined ARC and passivation layer for a solar cell. Namely, the SiN layer so deposited has a mass density of between about 2.0 and 2.8 g/$cm^3$ (e.g., mass density between about 2.6 and 2.8 g/$cm^3$), a refractive index of between about 2.0 and 2.6, and a hydrogen concentration of between about 5 atomic percent and 15 atomic percent. In one embodiment, a chamber pressure of 1.5 Torr may be maintained in the chamber and an RF power intensity of 0.74 W/$cm^2$ at a frequency of 13.56 MHz is applied to the showerhead 410 of the processing chamber 400 to generate a plasma for a period of time of about 9 seconds, while the first process gas mixture is delivered to the processing region 406. In one example, the processing chamber in which the ARC layer is formed is a plasma enhanced chemical vapor deposition (PECVD) chamber.

In one configuration, as discussed above, the layer formed in box 604 is part of a plurality of passivation layers, such as passivation layers 221 and 222, which are used to passivate the surface of the substrate. In one example, a passivation layer 221 is formed in box 604, which is a SiN layer that has a mass density of between about 2.6 and 2.8 g/$cm^3$, a refractive index of between about 2.4 and 2.6, and a hydrogen concentration of between about 5 atomic percent and 15 atomic percent.

Next, at box 606, a flow of the first process gas mixture is stopped, and a second process gas mixture is delivered into the chamber. In one example, the second process gas mixture may contain 5.5 sccm of silane ($SiH_4$), 16 sccm of ammonia ($NH_3$), and 40 sccm of nitrogen ($N_2$), per liter of chamber volume. In one embodiment, the plasma created in process(es) performed at box 604 is extinguished in the processing chamber and the flow of the first process gas mixture is stopped, before the second process gas mixture is introduced into the processing chamber. In one embodiment, the process "break" performed at box 606 lasts about 2 seconds. In this case, the first process gas mixture may be substantially purged from the chamber before the second process gas mixture is flowed into the chamber. The substrate support 430 temperature is generally maintained at a temperature of about 390° C. In one example, a PECVD deposition process is performed Finally, at box 608, a bulk SiN layer, or passivation layer 222, is deposited over the interface layer to form a dual stack SiN ARC/passivation layer on the substrates 210. In this way, the majority of the SiN passivation layer may be deposited by a substantially faster process without affecting the quality of solar cell passivation. If the plasma is extinguished in the chamber prior to the introduction of the second process gas mixture, then plasma is re-ignited to enable deposition of the bulk SiN layer. In one embodiment of the process 608, a chamber pressure of 1.5 Torr may be maintained in the processing chamber and an RF power intensity of 0.74 W/$cm^2$ at a frequency of 13.56 MHz is applied to the showerhead 410 of the processing chamber 400 to generate a plasma for a period of time of about 15 seconds, while the second process gas mixture is delivered to the processing region 406. In one example, the deposited bulk SiN layer has a mass density of between about 2.3 and 2.6 g/$cm^3$, a refractive index of between about 2.05 and 2.15, and a hydrogen concentration of between about 10 atomic percent and 25 atomic percent. In one example, the refractive index (n) value of the passivation layer 221 is 2.4 and that of the passivation layer 222 is 2.08, while the surface of the substrate 210 typically has a refractive index of about 3.0.

After performing the process sequence 300 processing steps the substrate may then be further processed to form a solar cell device that can be connected to an external grid that is adapted to collected the generated electrical current. In one example, additional metal and/or dielectric layers may be formed on the either side of the processed substrate (e.g., front surface 205, rear surface 206) to form the various solar cell device interconnect structures.

While the foregoing is directed to embodiments of the present invention, other and further embodiments of the invention may be devised without departing from the basic scope thereof, and the scope thereof is determined by the claims that follow.

The invention claimed is:

1. A method of passivating a surface a solar cell substrate, comprising:
    exposing a surface of a p-type doped region formed on a substrate to a first RF plasma that comprises a first processing gas and a first fluorine containing gas;
    exposing the surface of the p-type doped region to a second RF plasma that comprises a halogen gas; and
    RF biasing the substrate, during at least a portion of the exposing the surface to the second RF plasma, to form a negatively charged layer on the surface.

2. The method of claim 1, wherein the first processing gas comprises ammonia.

3. The method of claim 1, further comprising exposing the surface of the p-type doped region to a third RF plasma that comprises a second processing gas, a second fluorine containing gas and a hydrogen containing gas before exposing the surface of the p-type doped region to the second RF plasma.

4. The method of claim 3, wherein the first and the second processing gases comprise ammonia, and the first and the second fluorine containing gases further comprise nitrogen trifluoride, and wherein a molar ratio of ammonia to nitrogen trifluoride in the first and the second processing gases is between about 1:1 and 30:1.

5. The method of claim 1, wherein the halogen gas comprises fluorine or chlorine.

6. The method of claim 1, further comprising depositing a first silicon nitride-containing layer on the surface of the p-type doped region after forming the negatively charged layer on the surface.

7. The method of claim 6, further comprising depositing a second silicon nitride-containing layer on the first silicon nitride-containing layer.

8. The method of claim 1, wherein the second RF plasma does not contain a hydrogen containing gas.

9. The method of claim 1, wherein the exposing the surface to the first RF plasma is performed in a first processing chamber; and the method further comprises:

heating the substrate to a temperature greater than about 75° C. in a second processing chamber before exposing the surface of the p-type doped region to the second RF plasma; and transferring the substrate between the first and the second processing chambers in a controlled environment.

10. A method of passivating a surface a solar cell substrate, comprising:

exposing a surface of a p-type doped region formed on an n-type substrate to a first RF plasma that comprises a first processing gas and a first fluorine containing gas;

exposing the surface of the p-type doped region to a second RF plasma that comprises a second processing gas, a second fluorine containing gas and hydrogen containing gas;

exposing the surface of the p-type doped region to a third RF plasma that comprises a halogen gas;

RF biasing the substrate, during at least a portion of the exposing the surface to the third RF plasma, to form a negatively charged layer on the surface of the p-type doped region; and depositing a first silicon nitride-containing layer on the formed negatively charged layer.

11. The method of claim 10, wherein the first and the second processing gases comprise ammonia, the first and the second fluorine containing gases comprise nitrogen trifluoride, and wherein a molar ratio of ammonia to nitrogen trifluoride in the first and the second processing gases is between about 1:1 and 30:1.

12. The method of claim 11, wherein the halogen gas comprises fluorine or chlorine.

13. The method of claim 11, further comprising depositing a second silicon nitride-containing layer on the first silicon nitride-containing layer.

14. The method of claim 1, further comprising:

exposing the surface of the p-type doped region to a third RF plasma that comprises a second processing gas and a hydrogen containing gas before exposing the surface of the p-type doped region to the second RF plasma, wherein a p-type dopant in the p-type doped region comprises boron, and exposing the surface of the p-type doped region to the third RF plasma is performed until the surface of the substrate comprises at least 85% active boron.

15. The method of claim 1, wherein exposing the surface of the p-type doped region formed on the substrate to the first RF plasma is performed until an oxide layer comprising silicon and oxygen is removed from the surface of the p-type doped region.

* * * * *